United States Patent
Krisko et al.

(10) Patent No.: US 7,713,632 B2
(45) Date of Patent: *May 11, 2010

(54) LOW-MAINTENANCE COATINGS

(75) Inventors: Annette J. Krisko, Sauk City, WI (US); Kari Myli, Sauk City, WI (US); Gary L. Pfaff, Cazenovia, WI (US); James Brownlee, Cazenovia, WI (US)

(73) Assignee: Cardinal CG Company, Eden Prairie, MN (US)

( * ) Notice: Subject to any disclaimer, the term of this patent is extended or adjusted under 35 U.S.C. 154(b) by 354 days.

This patent is subject to a terminal disclaimer.

(21) Appl. No.: 11/179,178

(22) Filed: Jul. 12, 2005

(65) Prior Publication Data

US 2006/0057298 A1 Mar. 16, 2006

Related U.S. Application Data

(60) Provisional application No. 60/587,210, filed on Jul. 12, 2004, provisional application No. 60/659,491, filed on Mar. 7, 2005.

(51) Int. Cl.
*B32B 9/00* (2006.01)

(52) U.S. Cl. .................. 428/432; 428/428; 428/701; 428/702

(58) Field of Classification Search .............. 428/428, 428/432, 446, 448, 698, 699, 701, 702
See application file for complete search history.

(56) References Cited

U.S. PATENT DOCUMENTS

| | | | |
|---|---|---|---|
| 1,256,818 A | 2/1918 | Nile | 206/454 |
| 2,780,553 A | 2/1957 | Pawlyk | 106/1 |
| 2,808,351 A | 10/1957 | Colbert | 117/211 |
| 3,505,092 A | 4/1970 | Ryan | 117/33.3 |
| 3,528,906 A | 9/1970 | Cash, Jr. | 204/298 |
| 3,679,291 A | 7/1972 | Apfel et al. | 350/164 |
| 3,727,666 A | 4/1973 | Vander Sluis | 164/72 |
| 3,829,197 A | 8/1974 | Thelen | 359/588 |
| 3,840,451 A | 10/1974 | Golyanov | 204/192 |
| 3,844,924 A | 10/1974 | Cunningham | 204/298 |
| 3,852,098 A | 12/1974 | Bloss | 117/106 |

(Continued)

FOREIGN PATENT DOCUMENTS

CA 2290999 5/1998

(Continued)

OTHER PUBLICATIONS

Spectrum Response of the Vacuum-Deposited SiO$_2$/TiO$_2$ Multilayer Film With Improved Photo-Catalytic Activity, *Journal of Materials Science Letters* 20, 2001, pp. 2137-2140.

(Continued)

*Primary Examiner*—Timothy M Speer
(74) *Attorney, Agent, or Firm*—Fredrikson & Byron, P.A.

(57) ABSTRACT

The invention provides a substrate bearing a low-maintenance coating. The coating includes two films: a first film comprising silica (e.g., silicon dioxide) and a second film comprising titania (e.g., titanium dioxide). Preferably, both films are provided within particular thickness ranges. The invention also provides methods of depositing such coatings.

12 Claims, 3 Drawing Sheets

U.S. PATENT DOCUMENTS

| | | | |
|---|---|---|---|
| 3,854,796 A | 12/1974 | Thelen | 359/588 |
| 3,925,182 A | 12/1975 | Carmichael | 204/192 |
| 3,934,961 A | 1/1976 | Itoh | 359/586 |
| 3,968,018 A | 7/1976 | Lane | 204/192 |
| 3,970,037 A | 7/1976 | Sopko | 118/48 |
| 3,990,784 A | 11/1976 | Gelber | 350/166 |
| 4,029,566 A | 6/1977 | Brandmair | 204/290.08 |
| 4,045,125 A | 8/1977 | Farges | 350/166 |
| 4,052,520 A | 10/1977 | Chang | 427/164 |
| 4,060,660 A | 11/1977 | Carlson | 428/408 |
| 4,107,350 A | 8/1978 | Berg | 427/38 |
| 4,130,672 A | 12/1978 | Onoki | 427/164 |
| 4,166,018 A | 8/1979 | Chapin | 204/192.12 |
| 4,194,022 A | 3/1980 | Gillery | 427/109 |
| 4,212,663 A | 7/1980 | Aslami | 65/144 |
| 4,212,903 A | 7/1980 | Schnell | 427/127 |
| 4,214,014 A | 7/1980 | Hofer | 427/40 |
| 4,216,259 A | 8/1980 | Groth | 428/216 |
| 4,238,276 A | 12/1980 | Kinugawa | 156/634 |
| 4,252,629 A | 2/1981 | Bewer | 204/290.03 |
| 4,261,722 A | 4/1981 | Novak | 65/60 |
| 4,322,276 A | 3/1982 | Meckel | 204/192.26 |
| 4,332,922 A | 6/1982 | Kossmehl | 525/478 |
| 4,336,119 A | 6/1982 | Gillery | 204/192.13 |
| 4,351,861 A | 9/1982 | Henery | 428/255.1 |
| 4,377,613 A | 3/1983 | Gordon | 428/212 |
| 4,422,917 A | 12/1983 | Hayfield | 204/196.01 |
| 4,440,822 A | 4/1984 | Gordon | 428/216 |
| 4,465,575 A | 8/1984 | Love | 204/192 |
| 4,466,258 A | 8/1984 | Sando | 68/56 |
| 4,466,877 A | 8/1984 | McKelvey | 204/298.23 |
| 4,485,146 A | 11/1984 | Mizuhashi | 428/428 |
| 4,486,286 A | 12/1984 | Lewin | 204/192 |
| 4,503,125 A | 3/1985 | Nelson | 428/408 |
| 4,504,519 A | 3/1985 | Zelez | 427/39 |
| 4,568,622 A | 2/1986 | Minami | 430/51 |
| 4,569,738 A | 2/1986 | Kieser | 204/173 |
| 4,571,350 A | 2/1986 | Parker | 427/109 |
| 4,576,864 A | 3/1986 | Krautter | 428/328 |
| 4,661,409 A | 4/1987 | Kieser | 428/408 |
| 4,673,475 A | 6/1987 | Windischmann | 204/192.11 |
| 4,704,339 A | 11/1987 | Green | 428/689 |
| 4,713,311 A | 12/1987 | Senske | 430/127 |
| 4,717,622 A | 1/1988 | Kurokawa | 428/408 |
| 4,725,345 A | 2/1988 | Sakamoto | 204/192.31 |
| 4,728,529 A | 3/1988 | Etzkorn | 427/39 |
| 4,732,454 A | 3/1988 | Saito | 350/164 |
| 4,737,252 A | 4/1988 | Hoffman | 204/192.16 |
| 4,769,291 A | 9/1988 | Belkind | 428/630 |
| 4,777,090 A | 10/1988 | Ovshinsky | 428/408 |
| 4,780,334 A | 10/1988 | Ackerman | 427/248.1 |
| 4,798,660 A | 1/1989 | Ermer | 204/192.17 |
| 4,814,056 A | 3/1989 | Welty | 204/298.11 |
| 4,816,127 A | 3/1989 | Eltouky | 204/192.15 |
| 4,849,081 A | 7/1989 | Ross | 204/192.15 |
| 4,851,095 A | 7/1989 | Scobey | 204/192.12 |
| 4,859,493 A | 8/1989 | Lemelson | 427/451 |
| 4,861,680 A | 8/1989 | Meyer | 428/623 |
| 4,882,827 A | 11/1989 | Kusumi | 29/527.2 |
| 4,894,133 A | 1/1990 | Hedgcoth | 204/192.15 |
| 4,915,977 A | 4/1990 | Okamoto | 427/37 |
| 4,919,778 A | 4/1990 | Dietrich | 204/192.27 |
| 4,931,213 A | 6/1990 | Guajardo | 340/664 |
| 4,952,430 A | 8/1990 | Bowser | 428/34 |
| 4,961,958 A | 10/1990 | Desphandey | 427/38 |
| 4,981,568 A | 1/1991 | Taranko | 204/192.31 |
| 5,006,248 A | 4/1991 | Anderson | 210/500.25 |
| 5,008,002 A | 4/1991 | Uno | 204/192.31 |
| 5,020,288 A | 6/1991 | Swensen | 52/202 |
| 5,026,415 A | 6/1991 | Yamamoto | 65/305 |
| 5,032,421 A | 7/1991 | Sarma | 427/38 |
| 5,035,784 A | 7/1991 | Anderson | 204/158.14 |
| 5,047,131 A | 9/1991 | Wolfe | 204/192.23 |
| 5,071,206 A | 12/1991 | Hood | 359/360 |
| 5,073,241 A | 12/1991 | Watanabe | 204/192.15 |
| 5,073,450 A | 12/1991 | Nietering | 428/336 |
| 5,090,985 A | 2/1992 | Soubeyrand | 65/60.52 |
| 5,104,539 A | 4/1992 | Anderson | 210/500.25 |
| 5,105,310 A | 4/1992 | Dickey | 359/586 |
| 5,106,671 A | 4/1992 | Amberger | 428/215 |
| 5,107,643 A | 4/1992 | Swensen | 52/202 |
| 5,108,574 A | 4/1992 | Kirs | 208/298.22 |
| 5,126,218 A | 6/1992 | Clarke | 429/245 |
| RE34,035 E | 8/1992 | Dimigen | 428/244 |
| 5,139,633 A | 8/1992 | Kashida | 204/192.15 |
| 5,165,972 A | 11/1992 | Porter | 428/1 |
| 5,171,414 A | 12/1992 | Amberger | 204/192.26 |
| 5,190,807 A | 3/1993 | Kimock | 428/216 |
| 5,194,990 A | 3/1993 | Boulos | 359/587 |
| 5,196,400 A | 3/1993 | Chen | 505/476 |
| 5,201,926 A | 4/1993 | Szczyrbowski | 65/60.2 |
| 5,209,996 A | 5/1993 | Kashida | 430/5 |
| 5,211,759 A | 5/1993 | Zimmerman | 118/723 |
| 5,245,468 A | 9/1993 | Demiryont | 359/359 |
| 5,254,392 A | 10/1993 | Burns | 428/212 |
| 5,284,539 A | 2/1994 | McKernan | 156/154 |
| 5,286,524 A | 2/1994 | Slutz | 427/249 |
| 5,302,449 A | 4/1994 | Eby | 428/336 |
| 5,306,547 A | 4/1994 | Hood | 428/213 |
| 5,318,830 A | 6/1994 | Takamatsu | 428/246 |
| 5,338,422 A | 8/1994 | Belkind | 204/192.12 |
| 5,342,676 A | 8/1994 | Zagdoun | 428/216 |
| 5,346,600 A | 9/1994 | Nieh | 204/192.3 |
| 5,354,446 A | 10/1994 | Kida | 204/298.22 |
| 5,356,718 A | 10/1994 | Athey | 428/428 |
| 5,366,764 A | 11/1994 | Sunthankar | 427/248.1 |
| 5,378,527 A | 1/1995 | Nakanishi | 428/216 |
| 5,394,269 A | 2/1995 | Takamatsu | 359/580 |
| 5,401,543 A | 3/1995 | O'Neill | 427/580 |
| 5,405,517 A | 4/1995 | Lampkin | 204/192.12 |
| 5,415,756 A | 5/1995 | Wolfe | 204/192.23 |
| 5,424,130 A | 6/1995 | Nakanishi | 428/410 |
| 5,453,459 A | 9/1995 | Roberts | 524/123 |
| 5,470,661 A | 11/1995 | Bailey | 428/408 |
| 5,476,713 A | 12/1995 | Abiko | 428/332 |
| 5,482,602 A | 1/1996 | Cooper | 204/192.11 |
| 5,498,475 A | 3/1996 | Takigawa | 428/334 |
| 5,507,930 A | 4/1996 | Yamashita | 204/192.15 |
| 5,514,485 A | 5/1996 | Ando | 428/702 |
| 5,520,996 A | 5/1996 | Balian | 428/216 |
| 5,529,631 A | 6/1996 | Yoshikawa | 118/78 |
| 5,558,751 A | 9/1996 | Mahler | 204/298.26 |
| 5,569,362 A | 10/1996 | Lerbet | 204/192.16 |
| 5,569,501 A | 10/1996 | Bailey | 427/577 |
| 5,589,280 A | 12/1996 | Gibbons | 428/626 |
| 5,593,784 A | 1/1997 | Chinzi | 428/413 |
| 5,593,786 A | 1/1997 | Parker | 428/426 |
| 5,594,585 A | 1/1997 | Komatsu | 359/512 |
| 5,595,813 A | 1/1997 | Ogawa | 428/212 |
| 5,595,825 A | 1/1997 | Guiselin | 428/428 |
| 5,597,622 A | 1/1997 | Zoller | 427/563 |
| 5,599,422 A | 2/1997 | Adams | 156/510 |
| 5,605,609 A | 2/1997 | Ando | 204/192.23 |
| 5,607,723 A | 3/1997 | Plano et al. | 427/249 |
| 5,609,924 A | 3/1997 | McCurdy | 427/475 |
| 5,611,899 A | 3/1997 | Maass | 204/298.08 |
| 5,616,225 A | 4/1997 | Sieck | 204/298.14 |
| 5,618,388 A | 4/1997 | Seeser | 204/192.12 |
| 5,618,590 A | 4/1997 | Naruse | 427/528 |
| 5,620,572 A | 4/1997 | Bjornard | 204/192.12 |
| 5,624,423 A | 4/1997 | Anjur | 604/385.21 |
| 5,624,760 A | 4/1997 | Collins | 428/426 |
| 5,633,208 A | 5/1997 | Ishikawa | 438/699 |
| 5,643,423 A | 7/1997 | Kimock | 204/192.35 |

| | | | | | | | |
|---|---|---|---|---|---|---|---|
| 5,643,432 | A | 7/1997 | Qiu ............................. 205/50 | 6,261,693 | B1 | 7/2001 | Veerasamy ................... 428/408 |
| 5,645,699 | A | 7/1997 | Sieck ..................... 204/192.12 | 6,270,633 | B1 | 8/2001 | Onaka ..................... 204/192.12 |
| 5,645,900 | A | 7/1997 | Ong ............................ 427/571 | 6,299,981 | B1 | 10/2001 | Azzopardi ................... 428/429 |
| 5,669,144 | A | 9/1997 | Hahn ........................ 30/346.54 | 6,319,326 | B1 | 11/2001 | Koh ............................. 118/718 |
| 5,674,625 | A | 10/1997 | Takahashi ................... 428/428 | 6,326,079 | B1 | 12/2001 | Philippe et al. .............. 428/325 |
| 5,674,658 | A | 10/1997 | Burberry .................... 430/262 | 6,333,084 | B1 | 12/2001 | Woodard ...................... 428/34 |
| 5,679,431 | A | 10/1997 | Chen ......................... 428/65.3 | 6,334,938 | B2 | 1/2002 | Kida ..................... 204/298.13 |
| 5,683,560 | A | 11/1997 | Szczyrbowski ........ 204/298.23 | 6,350,397 | B1 | 2/2002 | Heikkila ....................... 264/39 |
| 5,683,561 | A | 11/1997 | Hollars ...................... 204/298 | 6,352,755 | B1 | 3/2002 | Finley et al. ................ 428/100 |
| 5,698,262 | A | 12/1997 | Soubeyrand ............. 427/255.3 | 6,354,109 | B1 | 3/2002 | Boire ........................... 65/60.1 |
| 5,723,172 | A | 3/1998 | Sherman ..................... 427/109 | 6,362,121 | B1 | 3/2002 | Chopin ............................. 502/2 |
| 5,733,660 | A | 3/1998 | Makita ....................... 428/426 | 6,365,010 | B1 | 4/2002 | Hollars .................. 204/192.12 |
| 5,733,669 | A | 3/1998 | Veyhl ......................... 428/698 | 6,379,746 | B1 | 4/2002 | Birch ........................... 427/154 |
| 5,745,291 | A | 4/1998 | Jenkinson ................... 359/586 | 6,379,776 | B1 | 4/2002 | Tada ........................... 428/149 |
| 5,755,867 | A | 5/1998 | Chikuni ................. 106/287.16 | 6,387,844 | B1 | 5/2002 | Fujishima et al. ........... 502/350 |
| 5,762,674 | A | 6/1998 | Maltby, Jr. .................. 65/60.1 | 6,403,689 | B1 | 6/2002 | Pickett ......................... 524/431 |
| 5,763,087 | A | 6/1998 | Falabella ..................... 428/408 | 6,413,581 | B1 | 7/2002 | Greenberg et al. .......... 427/226 |
| 5,780,119 | A | 7/1998 | Dearnaley ................... 427/528 | 6,414,213 | B2 | 7/2002 | Ohmori ....................... 502/350 |
| 5,780,149 | A | 7/1998 | McCurdy .................... 428/336 | 6,425,670 | B1 | 7/2002 | Komatsu ..................... 359/507 |
| 5,780,380 | A | 7/1998 | Endoh ......................... 502/300 | 6,447,123 | B2 | 9/2002 | Tonar ........................... 359/604 |
| 5,789,040 | A | 8/1998 | Martinu ...................... 427/575 | 6,451,178 | B2 | 9/2002 | Szczyrbowski ........ 204/192.13 |
| 5,811,191 | A | 9/1998 | Neuman ..................... 428/427 | 6,461,686 | B1 | 10/2002 | Vanderstraeten ............ 427/453 |
| 5,814,196 | A | 9/1998 | Hollars .................. 204/298.15 | 6,465,088 | B1 | 10/2002 | Talpaert .................... 428/307.3 |
| 5,820,994 | A | 10/1998 | Gotoh ......................... 428/451 | 6,468,402 | B1 | 10/2002 | Vanderstraeten ....... 204/192.15 |
| 5,830,252 | A | 11/1998 | Finley ........................ 65/60.5 | 6,488,824 | B1 | 12/2002 | Hollars .................. 204/192.22 |
| 5,830,327 | A | 11/1998 | Kolenkow ............. 204/192.12 | 6,511,587 | B2 | 1/2003 | Vanderstraeten ....... 204/298.13 |
| 5,830,332 | A | 11/1998 | Babich .................. 204/192.15 | 6,570,709 | B2 | 5/2003 | Katayama ................... 359/586 |
| 5,846,613 | A | 12/1998 | Neuville ..................... 427/575 | 6,635,155 | B2 | 10/2003 | Miyamura ............. 204/192.13 |
| 5,849,200 | A | 12/1998 | Heller ......................... 210/748 | 6,660,365 | B1 | 12/2003 | Krisko ......................... 428/149 |
| 5,853,866 | A | 12/1998 | Watanabe ................. 428/312.8 | 6,677,063 | B2 | 1/2004 | Finley ......................... 428/701 |
| 5,854,708 | A | 12/1998 | Komatsu ..................... 359/512 | 6,679,978 | B2 | 1/2004 | Johnson et al. ........ 204/192.22 |
| 5,866,199 | A | 2/1999 | Swidler ....................... 427/154 | 6,680,135 | B2 | 1/2004 | Boire et al. ................. 428/702 |
| 5,866,260 | A | 2/1999 | Adams, Jr. .................. 428/426 | 6,682,773 | B2 | 1/2004 | Medwick ..................... 427/154 |
| 5,869,187 | A | 2/1999 | Nakamura .................. 428/428 | 6,720,066 | B2 | 4/2004 | Talpaert .................... 428/307.3 |
| 5,869,808 | A | 2/1999 | Hyllberg ..................... 219/216 | 6,777,091 | B2 | 8/2004 | Kijima ........................ 428/428 |
| 5,871,843 | A | 2/1999 | Yoneda ....................... 428/337 | 6,789,906 | B2 | 9/2004 | Tonar ........................... 359/604 |
| 5,873,203 | A | 2/1999 | Thiel ............................ 52/172 | 6,800,183 | B2 | 10/2004 | Takahashi ............. 204/298.28 |
| 5,874,701 | A | 2/1999 | Watanabe ................ 204/157.15 | 6,818,309 | B1 | 11/2004 | Talpaert ....................... 428/432 |
| 5,888,593 | A | 3/1999 | Petrmichl ................... 427/563 | 6,829,084 | B2 | 12/2004 | Takaki ......................... 359/359 |
| 5,891,556 | A | 4/1999 | Anderson ................... 428/216 | 6,833,089 | B1 | 12/2004 | Kawahara ................... 428/212 |
| 5,935,716 | A | 8/1999 | McCurdy .................... 428/428 | 6,875,319 | B2 | 4/2005 | Nadaud ..................... 204/192.1 |
| 5,939,194 | A | 8/1999 | Hashimoto .................. 428/411 | 6,964,731 | B1 | 11/2005 | Krisko |
| 5,961,843 | A | 10/1999 | Hayakawa .................. 210/748 | 2001/0007715 | A1 | 7/2001 | Toyoshima ................. 428/426 |
| 5,965,246 | A | 10/1999 | Guiselin ..................... 428/212 | 2001/0016262 | A1 | 8/2001 | Toyoshima ............ 204/192.12 |
| 5,968,328 | A | 10/1999 | Teschner ............... 204/298.25 | 2002/0014634 | A1 | 2/2002 | Koyama ....................... 257/192 |
| 5,972,184 | A | 10/1999 | Hollars .................. 204/298.08 | 2002/0155265 | A1 | 10/2002 | Choi ............................ 428/212 |
| 6,013,372 | A | 1/2000 | Hayakawa ................ 428/411.1 | 2002/0155299 | A1 | 10/2002 | Harris .......................... 428/428 |
| 6,027,766 | A | 2/2000 | Greenberg ................... 427/226 | 2003/0039843 | A1 | 2/2003 | Johnson ....................... 428/432 |
| 6,037,289 | A | 3/2000 | Chopin et al. .................... 502/2 | 2003/0043464 | A1 | 3/2003 | Dannenberg ................. 359/585 |
| 6,045,903 | A | 4/2000 | Seino .......................... 428/331 | 2003/0064231 | A1 | 4/2003 | Hurst ........................... 428/432 |
| 6,054,227 | A | 4/2000 | Greenberg ................... 428/701 | 2003/0143437 | A1 | 7/2003 | Ohtsu .......................... 428/701 |
| 6,068,914 | A | 5/2000 | Boire .......................... 428/216 | 2003/0186089 | A1 | 10/2003 | Kikuchi ....................... 428/701 |
| 6,071,606 | A | 6/2000 | Yamazaki ................... 428/325 | 2003/0207028 | A1 | 11/2003 | Boire et al. .................. 427/226 |
| 6,071,623 | A | 6/2000 | Sugawara .................... 428/428 | 2003/0235695 | A1 | 12/2003 | Greenberg ................... 428/432 |
| 6,074,981 | A | 6/2000 | Tada ........................... 502/224 | 2004/0020761 | A1 | 2/2004 | Thomsen ................ 204/192.12 |
| 6,090,489 | A | 7/2000 | Hayakawa .................. 428/409 | 2004/0032655 | A1 | 2/2004 | Kikuchi ....................... 359/444 |
| 6,103,363 | A | 8/2000 | Boire et al. ................. 428/325 | 2004/0063320 | A1 | 4/2004 | Hollars ........................ 438/689 |
| 6,114,043 | A | 9/2000 | Joret ............................ 428/429 | 2004/0180220 | A1 | 9/2004 | Gueneau ...................... 428/446 |
| 6,124,044 | A | 9/2000 | Swidler ....................... 428/500 | 2005/0016835 | A1 | 1/2005 | Krisko |
| 6,154,311 | A | 11/2000 | Simmons, Jr. et al. ....... 359/359 | 2005/0020444 | A1 | 1/2005 | Hiraoka ....................... 502/350 |
| 6,156,171 | A | 12/2000 | Hollars .................. 204/298.25 | 2005/0025982 | A1 | 2/2005 | Krisko |
| 6,156,409 | A | 12/2000 | Doushita .................... 428/143 | 2005/0221098 | A1 | 10/2005 | Azzaopardi ................. 428/446 |
| 6,165,256 | A | 12/2000 | Hayakawa ................... 106/13 | 2005/0233899 | A1 | 10/2005 | Anzaki ........................ 502/350 |
| 6,165,598 | A | 12/2000 | Nelson ........................ 428/212 | 2006/0014050 | A1 | 1/2006 | Gueneau ...................... 428/702 |
| 6,165,616 | A | 12/2000 | Lemelson ................... 428/408 | 2006/0051597 | A1 | 3/2006 | Anzaki ........................ 428/432 |
| 6,171,659 | B1 | 1/2001 | Vanden Brande ........... 427/523 | 2006/0105103 | A1 | 5/2006 | Hartig |
| 6,191,062 | B1 | 2/2001 | Hayakawa ................... 502/159 | 2006/0121315 | A1 | 6/2006 | Myli |
| 6,193,378 | B1 | 2/2001 | Tonar ........................... 359/603 | 2007/0264494 | A1* | 11/2007 | Krisko et al. ................ 428/336 |
| 6,193,856 | B1 | 2/2001 | Kida ..................... 204/192.22 | | | | |
| 6,197,101 | B1 | 3/2001 | Matsumura ............. 106/287.11 | | | | |
| 6,210,750 | B1 | 4/2001 | Cho ............................ 427/190 | | | | |
| 6,210,779 | B1 | 4/2001 | Watanabe .................... 428/208 | | | | |
| 6,242,752 | B1 | 6/2001 | Soma ........................... 250/504 | | | | |

FOREIGN PATENT DOCUMENTS

| | | |
|---|---|---|
| DE | 43 13 284 | 10/1994 |
| DE | 19736925 | 3/1998 |

| | | |
|---|---|---|
| DE | 19644752 | 4/1998 |
| DE | 19831610 | 1/1999 |
| DE | 10100221 | 7/2001 |
| DE | 10100223 | 7/2001 |
| EP | 0 207 646 | 1/1987 |
| EP | 0 470 379 A | 2/1992 |
| EP | 0 279 550 | 4/1993 |
| EP | 0 369 581 B | 12/1993 |
| EP | 0 590 477 | 4/1994 |
| EP | 0 601 928 | 6/1994 |
| EP | 0 611 733 | 8/1994 |
| EP | 0 515 847 B1 | 2/1995 |
| EP | 0 636 702 | 2/1995 |
| EP | 0 637 572 | 2/1995 |
| EP | 0 639 655 | 2/1995 |
| EP | 0 657 562 | 6/1995 |
| EP | 0 689 096 A | 12/1995 |
| EP | 0 689 962 A | 1/1996 |
| EP | 0 737 513 | 10/1996 |
| EP | 0 328 257 A | 4/1997 |
| EP | 0 787 696 | 8/1997 |
| EP | 0 820 967 A | 1/1998 |
| EP | 0 771 766 | 9/1998 |
| EP | 0 753 882 | 11/1998 |
| EP | 0 884 288 | 12/1998 |
| EP | 0 799 255 | 2/1999 |
| EP | 0 901 991 | 3/1999 |
| EP | 0 838 535 | 2/2000 |
| EP | 0 850 203 | 1/2001 |
| EP | 0 850 204 | 12/2001 |
| EP | 0 944 557 | 11/2002 |
| EP | 1 254 870 | 11/2002 |
| EP | 0 737 513 | 9/2003 |
| EP | 0 887 104 | 11/2003 |
| EP | 1 375 444 | 1/2004 |
| EP | 1 411 386 | 4/2004 |
| EP | 1 074 525 | 9/2004 |
| EP | 1 466 665 A | 10/2004 |
| EP | 1 500 634 | 1/2005 |
| EP | 1 518 836 | 3/2005 |
| EP | 1 640 149 | 3/2006 |
| FR | 2699164 | 2/1995 |
| FR | 2738812 | 3/1997 |
| FR | 2738813 | 3/1997 |
| FR | 2738836 | 3/1997 |
| FR | 2800731 | 5/2001 |
| FR | 2814094 | 3/2002 |
| FR | 2838734 | 10/2003 |
| FR | 2838735 | 10/2003 |
| FR | 2857885 | 1/2005 |
| FR | 2861385 | 4/2005 |
| FR | 2861386 | 4/2005 |
| FR | 2869897 | 11/2005 |
| GB | 0232680 | 4/1925 |
| GB | 1231280 | 5/1971 |
| GB | 1438462 | 6/1976 |
| GB | 2028376 | 3/1980 |
| GB | 1595061 | 8/1981 |
| GB | 2201428 | 2/1988 |
| GB | 2316687 | 8/1997 |
| GB | 2327428 | 7/1998 |
| JP | 57-140339 A | 8/1982 |
| JP | 60081048 A | 5/1985 |
| JP | 61-091042 A | 5/1986 |
| JP | 62-161945 A | 7/1987 |
| JP | 01-014129 A | 1/1989 |
| JP | 01-118807 A | 5/1989 |
| JP | 3-122274 A | 5/1991 |
| JP | 3-187039 A | 8/1991 |
| JP | 3-193872 A | 8/1991 |
| JP | 7-149545 A | 6/1995 |
| JP | 7-215074 A | 8/1995 |
| JP | 7-233469 A | 9/1995 |
| JP | 7-508491 A | 9/1995 |
| JP | 7-315874 A | 12/1995 |
| JP | 7-315889 A | 12/1995 |
| JP | 8-011631 A | 1/1996 |
| JP | 8-012378 A | 1/1996 |
| JP | 8-109043 A | 4/1996 |
| JP | 8-134638 A | 5/1996 |
| JP | 8-227006 A | 9/1996 |
| JP | 9-189801 A | 7/1997 |
| JP | 9-202651 A | 8/1997 |
| JP | 9-249967 A | 9/1997 |
| JP | 10-36144 A | 2/1998 |
| JP | 10-048805 A | 2/1998 |
| JP | 11-095014 A | 4/1999 |
| WO | WO 87/06626 | 11/1987 |
| WO | WO 92/17621 A | 10/1992 |
| WO | WO 96/25534 | 8/1996 |
| WO | WO 97/03763 | 2/1997 |
| WO | WO 97/07066 | 2/1997 |
| WO | WO 97/07069 | 2/1997 |
| WO | WO 97/08359 | 3/1997 |
| WO | WO 97/10185 | 3/1997 |
| WO | WO 97/10186 | 3/1997 |
| WO | WO 97/11916 | 4/1997 |
| WO | WO 97/15499 | 5/1997 |
| WO | WO 97/25201 | 7/1997 |
| WO | WO 97/37946 | 10/1997 |
| WO | WO 97/42351 | 11/1997 |
| WO | WO 97/42357 | 11/1997 |
| WO | WO 98/06675 | 2/1998 |
| WO | WO 98/23549 | 6/1998 |
| WO | WO 98/25700 | 6/1998 |
| WO | WO 00/13257 | 3/2000 |
| WO | WO 00/37376 | 6/2000 |
| WO | WO 00/37377 | 6/2000 |
| WO | WO 00/50354 | 8/2000 |
| WO | 0075083 | 12/2000 |
| WO | WO 00/75087 | 12/2000 |
| WO | WO 01/02496 | 1/2001 |
| WO | WO 01/32578 | 5/2001 |
| WO | WO 01/71055 | 9/2001 |
| WO | WO 03/012540 | 2/2002 |
| WO | WO 02/024971 | 3/2002 |
| WO | WO 02/085809 | 10/2002 |
| WO | WO 03/050056 | 6/2003 |
| WO | WO 03/053577 | 7/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/106732 | 12/2003 |
| WO | 2004/061151 | 7/2004 |
| WO | WO 2004/067464 | 8/2004 |
| WO | WO 2004/085701 | 10/2004 |
| WO | WO 2004/108619 | 12/2004 |
| WO | WO 2004/113064 | 12/2004 |
| WO | WO 2005/000758 | 1/2005 |
| WO | WO 2005/000759 | 1/2005 |
| WO | WO 2005/009914 | 2/2005 |
| WO | WO 2005/012593 | 2/2005 |
| WO | WO 2005/040056 | 5/2005 |
| WO | WO 2005/040058 | 5/2005 |
| WO | WO 2005/102953 | 11/2005 |
| WO | WO 2005/110937 | 11/2005 |
| WO | 2006017311 | 2/2006 |
| WO | 2006017349 | 2/2006 |

OTHER PUBLICATIONS

Anderson et al., "Improved Photocatalytic Activity and Characterization of Mixed $TiO_2/SiO_2$ and $TiO_2/Al_2O_3$ Materials", *J. Phys. Chem.*, 1997, 101, 2611-2616.

Anderson et al., "An Improved Photocatalyst of $TiO_2/SiO_2$ prepared by a Sol-Gel Synthesis", *J. Phys. Chem.*, 1995, 99, 9882-9885.

Chen Wen-mei et al, "The Effect of $SiO_2$ Additive on Super-hydrophilic Property of $TiO_2$-$SiO_2$ Thin Film by Sol-gel Method", *Journal of Wuhan University of Technology-Mater. Sci. Ed.* (Sep. 2001), vol. 16, No. 3, 30-33.

Guan et al, "Enhanced effect and mechanism of $SiO_2$ addition in super-hydrophilic property of $TiO_2$ films" *Surf. And Coating Tech 173*(2003) pp. 219-223.

Guan, "Relationship between photocatalytic activity, hydrophilicity and self-cleaning effect of $TiO_2/SiO_2$ films" *Surf. And Coating Tech 191*(2005) pp. 155-160.

Guan, "Hydrophilic property of $TiO_2/SiO_2$ mixing films" *Trans. Nonferrous Met. Soc. China* (2004), vol. 14, No. 2, pp. 251-254.

Ingo et al., "XPS studies of $SiO_2$-$TiO_2$ powders prepared by sol-gel process", *Appl. Surf. Sci.* 1993, 70/71A, pp. 230-234.

Lassaletta et al., "Spectroscopic Characterization of Quantum-Sized $TiO_2$ Supported on Silica: Influence of Size and $TiO_2$-$SiO_2$ Interface Composition", *J. Phys. Chem.*, 1995, 99, 484-1490.

Matthews et al., "An Adsorption Water Purifier with in Situ Photocatalytic Regeneration", *J. Catal.* 1988, 113, pp. 549-555.

Minero et al., "Role of Adsorption in Photocatalyzed Reactions of Organic Molecules in Aqueous of $TiO_2$ Suspensions", *Langmuir*, 1992, 113, pp. 481-486.

Miyashita, et al., "Enhanced Effect of Vacuum-deposited SiO2 Overlayer on Photo-induced Hydrophilicity of TiO2 Film", *Journal of Materials Science 36*(2001) p. 3877-3884.

Miyashita et al., "Spectrum response of the vacuum-deposited $SiO_2$/$TiO_2$ multilayer film with improved photo-catalytic activity", *Journal of Materials Science Letters*, 2001, 20, 2137-2140.

Nakamura, et al., "Hydrophilic property of $SiO_2/TiO_2$ double layer films" *Photocatalytic Coatings, Panel Session*, pp. 345-350.

Niwa et al., Ammoxidation of Toluene Over $SiO_2$-$Al_2O_3$ $ZrO_2$-$SiO_2$ and $TiO_2$- $SiO_2$, *J. Catal.* 1981, 69, pp. 69-76.

Novotná, et al., "Photocatalytical $TiO_2/SiO_2$-PDMS layers on glass" *Photocatalytic Coatings, Panel Session*, pp. 383-387.

Ohsaki, et al., "Photocatalytic properties of $SnO_2/TiO_2$ multilayers" *Photocatalytic Coatings, Panel Session*, pp. 369-376.

Ramirez-Del-Solar et al., "Effect of the Method of Preparation on the Texture of $TiO_2$-$SiO_2$ Gels", *J. Non-Cryst. Solids* 1990, 121, pp. 84-89.

Salvado et al., "$TiO_2$-$SiO_2$ glasses prepared by the alkoxide route", *J. Non-Cryst. Solids* 1992, 147/148, pp. 256-261.

Satoh et al., "Sol-gel-derived binary silica glasses with high refractive index", *J. Non-Cryst. Solids* 1992, 146, pp. 121-128.

Schraml-Marth et al., "Porous silica gels and $TiO_2$-$SiO_2$ mixed oxides prepared via the sol-gel process: characterization by spectroscopic techniques", *J. Non-Cryst. Solids* 1992, 143, pp. 93-111.

Shibata, K., et al., "Acidic Properties of Binary Metal Oxides", *Bull. Chem. Soc. Jpn.* 1973, 46, pp. 2985-2988.

Stakheev, et al., "XPS and XAES Study of $TiO_2$-$SiO_2$ Mixed Oxide System", *J. Phys. Chem.* 1993, 97, pp. 5668-5672.

Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.

Yu et al., "The grain size and surface hydroxyl content of super-hydrophilic $TiO_2$-$SiO_2$ composite nanometer thin films" *J. Mat. Sci. Lett.* (2001) 20, pp. 1745-1748.

Veersamy, et al., "Optical and Electronic Properties of Amorphous Diamond." *Diamond and Related Materials*, vol. 2 (1993), pp. 782-787.

"Surface Hardening of Ceramic and Glass Materials," *IBM Technical Disclosure Bulletin*, vol. 36, Issue 1 (Jan. 1993), p. 225.

"Surface Hardening of Ceramic and Glass Materials," *IBM Technical Disclosure Bulletin*, vol. 36, Issue 3 (Mar. 1993), pp. 291-292.

MikroElektronick—High-rate Sputtering System for Two-Sided Coating (HZS-04).

Kobayashi et al., "$V_2 O_5$-$WO_3$/$TiO_2$-$SiO_2$-$SO_4^{2-}$ catalysts: Influence of active components and supports on activities in the selective catalytic reduction of NO by $NH_3$ and in the oxidation of $SO_2$" *App. Cat. B: Enviro 63.* (2006), pp. 104-113.

Abstract—Japanese Patent Publication 4-276066.

Abstract—Japanese Patent Publication 5-214525.

Abstract—Japanese Patent Publication 6-330297.

Derwent Abstract 007612002 (Abstract of JP 879697).

Abstract Japanese Patent Publication 08158048A.

* cited by examiner

US 7,713,632 B2

LOW-MAINTENANCE COATINGS

CROSS REFERENCE To RELATED APPLICATIONS

The present application claims priority to provisional U.S. patent application filed Jul. 12, 2004 and assigned Ser. No. 60/587,210, and provisional U.S. patent application filed Mar. 7, 2005 and assigned Ser. No. 60/659,491, the entire disclosures of which are incorporated herein by reference.

FIELD OF THE INVENTION

The present invention provides thin film coatings for glass sheets and other substrates. More particularly, the invention provides thin film coatings including a thin photocatalytic film, such as titania, deposited over a thin base layer, such as silica. The invention also provides methods of depositing such coatings onto glass sheets and other substrates.

BACKGROUND OF THE INVENTION

For many years, it has been known that titanium dioxide can be used as a photocatalyst. A great deal of research has been done with a view toward providing photocatalytic coatings that have self-cleaning properties. The pursuit of self-cleaning photocatalytic window coatings, in particular, has been an active field of exploration. Such coatings typically involve a titanium dioxide layer carried by a glass pane. These coatings are commonly provided with a relatively thick layer of titanium dioxide and/or a specific under-layer system designed for achieving high levels of photoactivity. Thick titanium dioxide layers, unfortunately, produce high levels of visible reflectance, thus creating a somewhat mirror-like appearance. This high visible reflection tends to exaggerate the appearance of dirt on a window. Further, known under-layer systems commonly teach that specific materials and crystal structures must be used for the under-layer film(s) to achieve acceptable photoactivity levels. Moreover, many photocatalytic coating systems teach that heating is required during or after film deposition to achieve acceptable levels of photoactivity.

Known photocatalytic coatings also tend to have properties that are less than ideal for applications in which the coatings are used on windows. As noted above, the visible reflectance of many known photocatalytic coatings is unacceptably high. Moreover, the reflected colors of these coatings tend not to be ideal. Further, some of these coatings have particularly high surface roughness, as they are designed to have large surface areas that facilitate high photoactivity levels. These rough coatings, unfortunately, tend to be quite vulnerable to being abraded. They are also particularly susceptible to taking on and stubbornly retaining dirt and other contaminants, due to their high surface roughness. Finally, with many recent photocatalytic coatings (e.g., those in which complex under-layer systems are used to maximize photoactivity), it is unclear whether these coatings will exhibit the longevity (e.g., in-field durability over time) that is required for number-one-surface coatings.

The present invention provides low-maintenance coatings that offer exceptional durability, exceptional optical properties, reliable production processes, and surprising cleanliness/maintenance properties.

SUMMARY OF THE INVENTION

In certain embodiments, the invention provides a low-maintenance coating on a glass sheet. The low-maintenance coating comprises a first film positioned directly over a first major surface of the glass sheet and a second film positioned directly over the first film. In various embodiments of the present invention, the first film includes a thin base film, (e.g. silica) that has a thickness of less than about 300 angstroms, alternatively less than about 150 angstroms, and further alternatively between about 70 angstroms and about 120 angstroms. The second film in various embodiments of the present invention includes a thin photocatalytic film (e.g. titania) that has a thickness of less than about 300 angstroms, alternatively less than about 150 angstroms, and further alternatively between about 30 angstroms and about 120 angstroms.

In other embodiments, the invention provides a method of depositing a low-maintenance coating. The method comprises depositing a low-maintenance coating on a glass sheet by depositing first film directly over a first major surface of the glass sheet and then depositing a second film directly over the first film. In one embodiment of the present invention, the first film comprises silica and is deposited at a thickness of between about 70 angstroms and about 120 angstroms. The second film comprises titania and is deposited at a thickness of between about 30 angstroms and about 120 angstroms. In some of these embodiments, both films are deposited by sputtering, preferably while maintaining the substrate at a low temperature (e.g., less than about 250 degrees Celsius, and preferably less than 200 degrees Celsius).

DETAILED DESCRIPTION OF PREFERRED EMBODIMENTS

Figure 1:
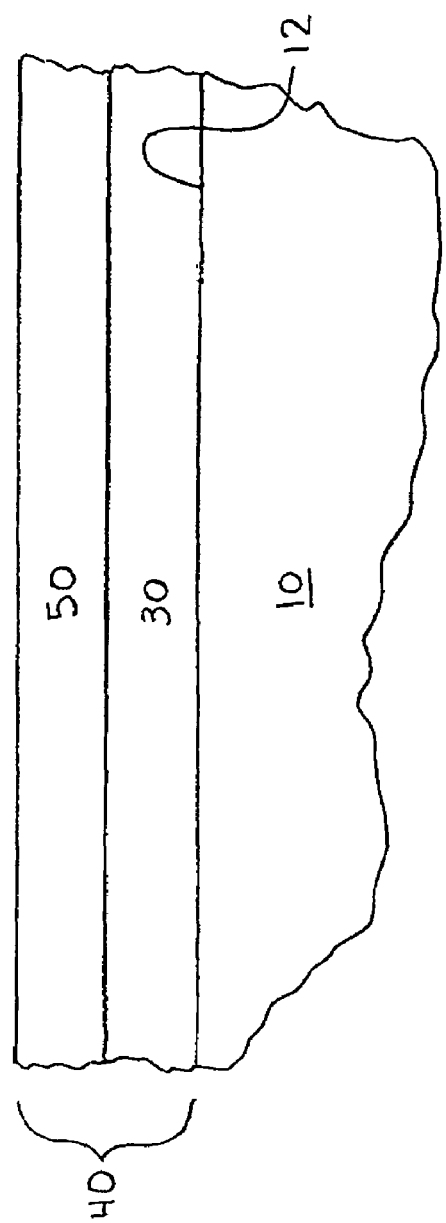
FIG. 1 is a partially broken-away schematic cross-sectional side view of a substrate bearing a low-maintenance coating in accordance with certain embodiments of the invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the given examples have many alternatives that fall within the scope of the invention.

In certain embodiments, the invention provides a substrate 10 bearing a low-maintenance coating 40. A variety of substrates are suitable for use in the invention. Preferably, the substrate 10 is a sheet-like substrate having generally or substantially opposed first 12 and second 14 major surfaces. In many embodiments, the substrate is a sheet of transparent material (i.e., a transparent sheet). The substrate, however, is not required to be transparent. For most applications, though, the substrate will comprise a transparent (or at least translucent) material, such as glass or clear plastic. For example, the substrate 10 is a glass sheet (e.g., a window pane) in preferred embodiments. A variety of known glass types can be used, and soda-lime glass is preferred.

Substrates of various sizes can be used in the present invention. Commonly, large-area substrates are used. Certain embodiments involve a substrate 10 having a width of at least about 0.5 meter, preferably at least about 1 meter, perhaps more preferably at least about 1.5 meters (e.g., between about 2 meters and about 4 meters), and in some cases at least about 3 meters.

Substrates of various thicknesses can be used in the present invention. Commonly, substrates (e.g., glass sheets) having a thickness of about 1-5 mm are used. Certain embodiments involve a substrate 10 with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm will be used.

In certain embodiments, the invention provides a substrate 10 bearing a low-maintenance coating 40. The coating 40 is preferably deposited over (e.g., over an entirety of) a major surface 12 of the substrate 10. The low-maintenance coating 40 includes two films: (1) a first film 30 deposited over a major surface 12 of the substrate 10; and (2) a second film 50 deposited over the first film 30.

In various embodiments of the present invention, the first film 30 includes a base film, such as silica (e.g., silicon dioxide), and desirably is deposited directly over the substrate 10 (e.g., directly over a major surface 12 of the substrate). This film preferably consists of, or consists essentially of, silicon dioxide. The silica in the first film 30, however, can include small amounts of an electrically-conductive material, such as aluminum, which may be oxidized in the film 30. For example, this film 30 can be deposited by sputtering a silicon-containing target that includes a small amount of aluminum or another metal that enhances the electrical conductivity of the target. The first film 30 (an entire thickness of which may consist essentially of silica) desirably has (e.g., is deposited at) a physical thickness of less than about 300 angstroms, alternatively less than about 150 angstroms (e.g., between about 40 angstroms and about 150 angstroms), and further alternatively about 70 angstroms and about 120 angstroms. These incredibly small thicknesses facilitate a surprisingly array of exceptional properties in the present coating.

The coating 40 includes a second film 50 that includes a photocatalytic film, such as titania, and desirably is deposited directly over the first film 30. It is noted that one or more photocatalytic materials may be used in embodiments of the present invention including but not limited to oxides of titanium, iron, silver, copper, tungsten, aluminum, zinc, strontium, palladium, gold, platinum, nickel, cobalt and combinations thereof. In preferred embodiments, this film 50 consists of, or consists essentially of, titanium dioxide. In some embodiments though, the second film 50 consists of, or consists essentially of, substoichiometric titanium oxide ($TiO_x$, where x is less than 2). The second film 50 (an entire thickness of which may consist essentially of titania) desirably has (e.g., is deposited at) a physical thickness of less than about 300 angstroms, alternatively less than about 150 angstroms (e.g., between about 30 angstroms and about 150 angstroms), and further alternatively between about 30 angstroms and about 120 angstroms. It has been discovered that the second film 50 when provided at these incredibly small thicknesses, particularly when consisting essentially of titanium oxide and provided in combination with a first film consisting essentially of silicon dioxide at the noted thicknesses, provides unexpected maintenance properties (including exceptional characteristics in terms of taking on limited amounts of dirt and other contaminants and providing easy removal of those contaminants that do accumulate on the coating), while at the same time achieving exceptionally low visible reflection, neutral color, and exceptional durability. Moreover, in preferred embodiments, the second film is a sputtered film deposited at low temperatures (e.g., sputter deposited while maintaining the substrate at less than about 250 degrees Celsius and preferably less than 200 degrees Celsius), and it is especially surprising that a sputtered film of this nature exhibits such exceptional low-maintenance properties.

Certain particular embodiments provide a substrate 10 (e.g., a glass sheet) having a first major surface 12 directly over which is deposited a first film 30 consisting essentially of silica (e.g., $SiO_2$) at a thickness of between about 70 angstroms and about 120 angstroms, wherein a second film 50 consisting essentially of titania (e.g., $TiO_2$) is deposited directly over the first film 30 at a thickness of between about 30 angstroms and about 300 angstroms. In some preferred embodiments of this nature, the first film 30 has a thickness of between about 70 angstroms and about 120 angstroms, perhaps optimally about 100 angstroms, while the second film 50 has a thickness of between about 30 angstroms and about 120 angstroms, perhaps optimally about 100 angstroms.

In a further embodiment, the thickness of the second film 50 is less than 100 angstroms (and optionally less than about 80 angstroms) but greater than about 30 angstroms, while the first film 30 has a thickness of less than about 300 angstroms (and optionally less than about 100 angstroms) but greater than about 30 angstroms. In some cases of this nature, the first film consists essentially of silica while the second film consists essentially of titania.

In the present coating 40, the second film 50 desirably is the outermost film of the coating. Conventional wisdom in the art would suggest that the thin nature of the present coating 40 would not have enough photoactivity to give desirable self-cleaning properties, especially for embodiments where the second film 50 is sputtered, particularly while maintaining the substrate at a low temperature. Surprisingly, though, the present coating is incredibly effective in keeping windows (e.g., monolithic panes or IG units) free of the particular contaminants that build up on windows during the course of routine production. The present coatings also exhibit advantageous water-sheeting properties, while at the same time having exceptional optical properties and durability.

Figure 3:
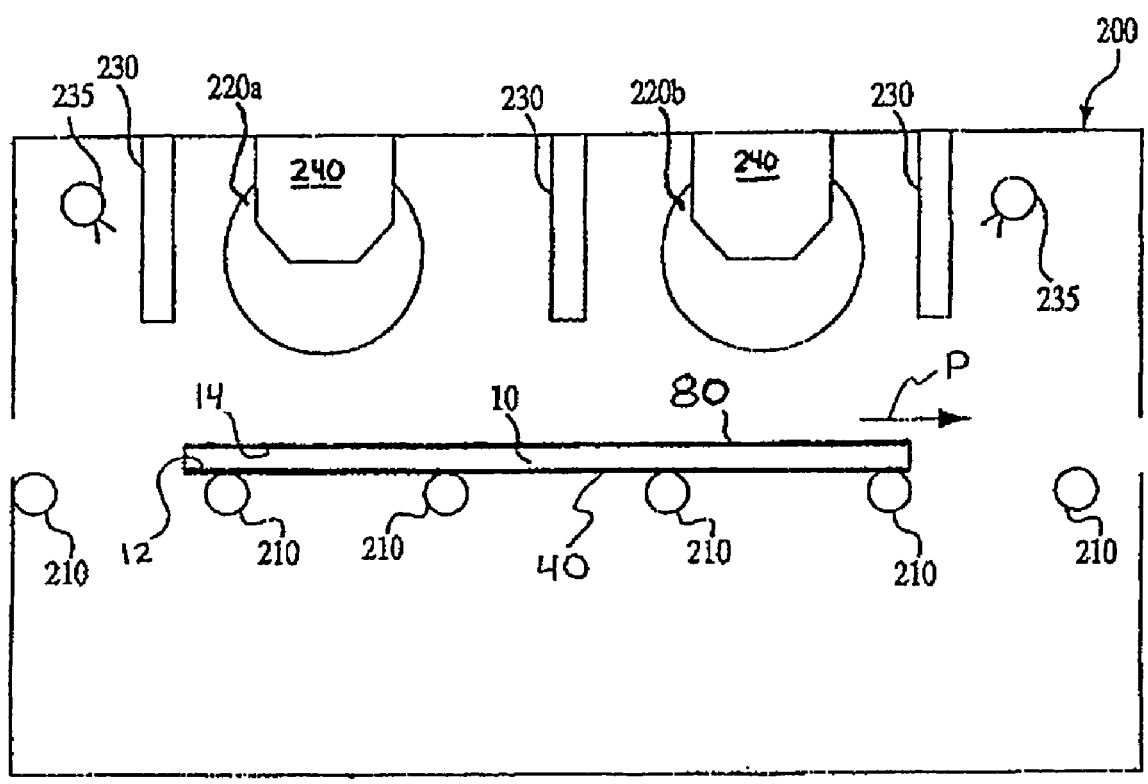
FIG. 3 is a schematic side end view of a sputtering chamber that is adapted for use in certain methods of the invention.

In FIG. 3, the illustrated substrate 10 is provided with two coatings: the low-maintenance coating 40 on the first surface 12 of the substrate and a low-emissivity coating 80 on the second surface 14 of the substrate. It is noted that, alternatively, in an insulating glass unit, the low-emissivity coating 80 may be positioned on the third surface of the insulated glass unit (the third surface is considered the surface of the second, e.g., inboard, pane that is exposed to the between-pane space of the insulated glass unit). The low-emissivity coating 80 is optional. When provided, any desired low-emissivity coating can be used. Suitable examples of a low-emissivity coating are described in U.S. patent application Ser. No. 09/728,435, entitled "Haze-Resistant Transparent Film Stacks", the entire teachings of which are incorporated herein by reference.

Figure 2:
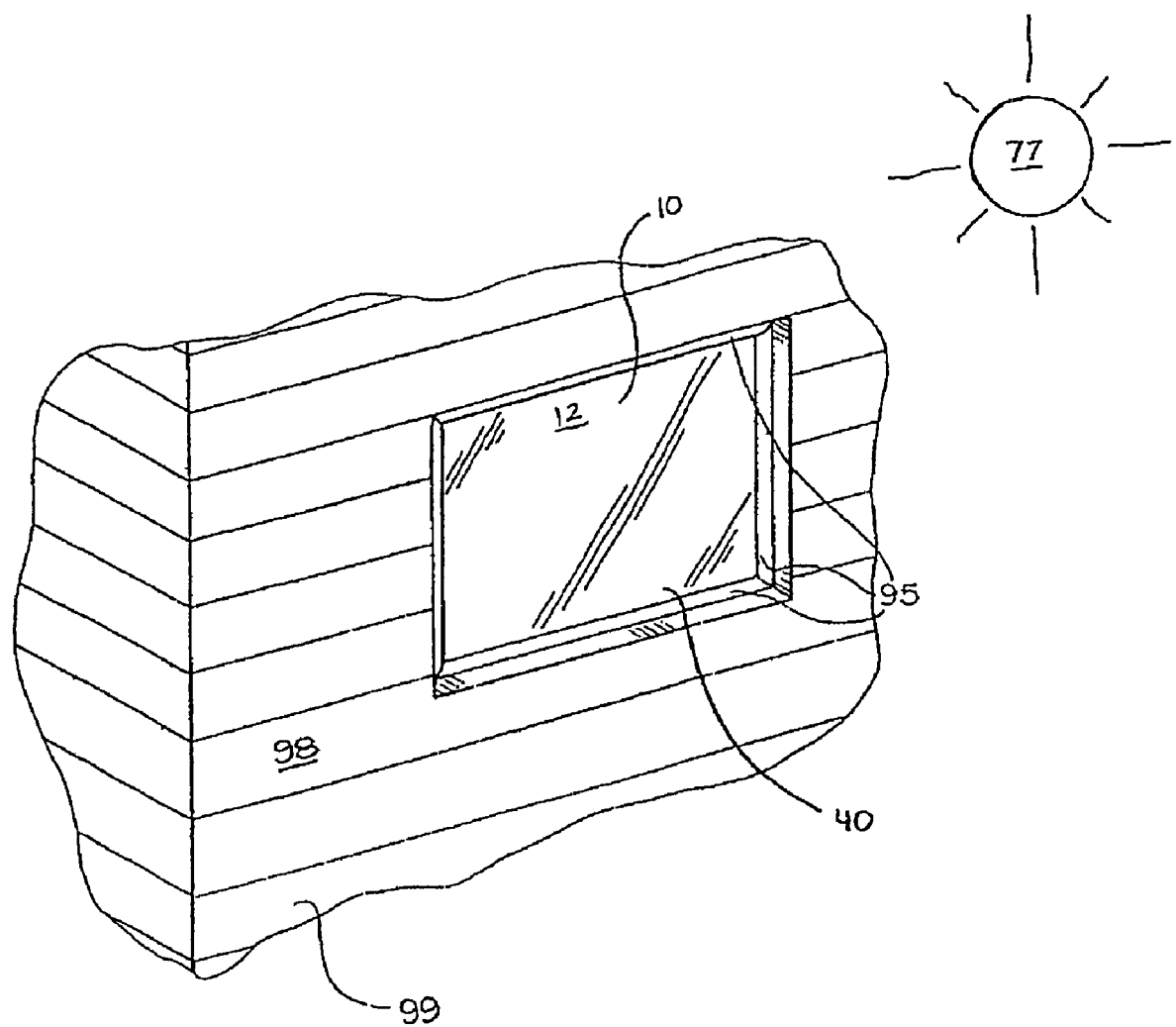
FIG. 2 is a partially broken-away perspective view of a window pane bearing a low-maintenance coating, the pane is mounted in an exterior wall of a building in accordance with certain embodiments of the invention.

With reference to FIG. 2, the low-maintenance coating 40 is preferably on the "first" surface of a window. This can be appreciated with reference to FIG. 2, which exemplifies embodiments wherein the substrate 10 (which may be a glass pane) is a window pane that is mounted on a window frame 95 (e.g., in an exterior wall 98 of a building 99). In certain applications, the coated first surface (i.e., the surface 12 on which the coating 40 is provided) of such a window will be exposed to an outdoor environment (e.g., such that the coating 40 will be in periodic contact with rain). In another embodiment, the low-maintenance coating is applied to the "fourth" surface of a window (e.g., the #4 surface of a double-pane window unit), optionally in addition to providing the low-maintenance coating 40 on the first surface of the same window. Further, in monolithic windows, the low-maintenance coating 40 can be provided on only the #1 surface, on only the #2 surface, or on both the #1 and #2 surfaces.

The invention also provides methods for producing coated substrates. These methods involve depositing a low-maintenance coating 40 (i.e., by depositing each film 30, 50 of any embodiment described above) upon a substrate 10. As noted above, the low-maintenance coating includes two films. These films 30, 50 can be deposited by a variety of well known coating techniques. In certain particularly preferred embodiments, the coating 40 (or at least the second film 50) is deposited by sputtering, preferably at a low temperature (e.g., while maintaining the substrate at below about 250 degrees Celsius, and more preferably below 200 degrees Celsius). However, other coating techniques, such as chemical vapor deposition (CVD), plasma enhanced chemical vapor deposition, and pyrolytic deposition can be used. Various embodiments of the coating 40 have been described, and the present methods involve depositing any of the described coating embodiments by any thin film deposition method, with sputtering being preferred, though not required, for at least the second film 50 and preferably for the whole coating 40.

Sputtering is well known in the present art. FIG. 3 depicts an exemplary magnetron sputtering chamber 200. Magnetron sputtering chambers and related equipment are commercially available from a variety of sources (e.g., Leybold). Useful magnetron sputtering techniques and equipment are described in U.S. Pat. No. 4,166,018, issued to Chapin, the entire teachings of which are incorporated herein by reference.

In preferred embodiments, the invention provides methods of producing a coated substrate by sputter depositing onto the substrate each film of any above-described coating embodiment. Preferably, the sputtering of the coating 40 (or at least the sputtering of the second film 50) is carried out while maintaining the substrate at a temperature of less than about 250 degrees Celsius, and more preferably less than 200 degrees Celsius (e.g., without heating the substrate).

In favored methods of the invention, the low-maintenance coating 40 is applied to a substrate 10 in a multiple-chamber sputtering line. Sputtering lines are well known in the present art. A typical sputtering line includes a series of sputtering chambers aligned and connected such that a sheet-like substrate can be passed from one chamber to the next by conveying the substrate horizontally over spaced-apart transport rollers 210 in each of the chambers (the rollers form a continuous path of substrate travel P through the sputtering line). The substrate is typically conveyed at speeds of between about 100-500 inches per minute.

In one particular method, the substrate 10 is positioned at the inlet of the sputtering line and conveyed to a desired coat zone. This coat zone is provided with three cathodes that are adapted to deposit the first film 30. In more detail, each of these cathodes comprises a silicon sputtering target. The silicon targets in this coat zone are sputtered in an oxidizing atmosphere to deposit a silicon dioxide film directly upon the first major surface 12 of the substrate. This atmosphere may consist essentially of oxygen (e.g., about 100% $O_2$). Alternatively, this atmosphere may comprise Ar/$O_2$ (e.g., oxygen and up to about 40% argon). A power of about 38 kW is applied to the first cathode, while a power of about 38 kW is applied to the second cathode, and a power of about 38 kW is applied to the third cathode. The substrate 10 is conveyed beneath all three of these targets at a rate of about 200 inches per minute, while sputtering each of these targets at the noted power level, such that a silicon dioxide film is applied at a thickness of about 100 Å. As noted above, each silicon target may include some aluminum or another material to enhance the conductivity of the target.

The thus coated substrate is then conveyed into a subsequent coat zone. In this zone, three cathodes are used to deposit the second film 50. Each of these three cathodes comprises a titanium sputtering target. The titanium targets in this coat zone are sputtered in an oxidizing atmosphere to deposit a titanium dioxide film directly upon the first film 30. This atmosphere may consist essentially of oxygen. Alternatively, this atmosphere may comprise Ar/$O_2$. A power of about 43 kW is applied to the first cathode, a power of about 43 kW is applied to the second cathode, and a power of about 43 kW is applied to the third cathode. The substrate 10 is conveyed beneath all three of these targets at a rate of about 200 inches per minute, while sputtering each of these targets at the noted power level, such that a titanium dioxide film is applied at a thickness of about 100 Å. This titanium dioxide forms the outermost portion (and is exposed) of the coating 40 in the present embodiment.

In the method just described, it is to be appreciated that the second major surface 14 of the substrate 10 may previously have been, or may subsequently be, coated with an optional low-emissivity coating 80. For instance, the coat zones just described for use in depositing the first 30 and second 50 films can be a sputter-up coat zones located toward the end of a sputtering line that includes a relatively large number of preceding sputter-down coat zones in which the optional low-emissivity coating 80 may have been applied. Particularly useful sputter-up/sputter-down methods and equipment are described in U.S. patent application Ser. No. 09/868,542, the entire contents of which are incorporated herein by reference.

While preferred embodiments of the present invention have been described, it should be understood that numerous changes, adaptations, and modifications can be made therein without departing from the spirit of the invention and the scope of the appended claims.

What is claimed is:

1. A low-maintenance coating on a glass sheet, the coating comprising a first film positioned directly over a first major surface of the glass sheet and a second film positioned directly over the first film, wherein the first film includes a base film and has a thickness of less than about 100 angstroms, and wherein the second film includes a photocatalytic film and has a thickness of less than about 100 angstroms.

2. The low-maintenance coating of claim 1 wherein the base film is silica.

3. The low-maintenance coating of claim 2 wherein the coated first major surface is in periodic contact with rain.

4. The low-maintenance coating of claim 1 wherein the photocatalytic film is titania.

5. The low-maintenance coating of claim 1 wherein the thickness of the first film is between about 70 angstroms and about 100 angstroms.

6. The low-maintenance coating of claim 1 wherein the thickness of the second film is between about 30 angstroms and about 120 angstroms.

7. The low-maintenance coating of claim 1 wherein the glass sheet is a window pane mounted in a window frame, and wherein the coated first major surface is exposed to an outdoor environment.

8. The low-maintenance coating of claim 1 wherein the first film consists essentially of silica and the second film consists essentially of titania.

9. The low-maintenance coating of claim 8 wherein the silica is silicon dioxide, and the titania is titanium dioxide or substoichiometric titanium oxide.

10. The low-maintenance coating of claim 1 wherein the first and second films are both sputtered films.

11. A low-maintenance coating on a glass sheet, the coating comprising a first film positioned directly over a first major surface of the glass sheet and a second film positioned directly over the first film, wherein the first film consists essentially of silica and has a thickness of between about 30 angstroms and about 100 angstroms, and wherein the second film consists essentially of titania and has a thickness of less than 100 angstroms but greater than about 30 angstroms.

12. The low-maintenance coating of claim 11 wherein the second film has a thickness of less than about 80 angstroms.

* * * * *